United States Patent
Ho et al.

(10) Patent No.: US 7,233,869 B2
(45) Date of Patent: Jun. 19, 2007

(54) PHASE COMPARING METHOD AND APPARATUS IN WHICH A SAMPLED PERIODIC SIGNAL HAS A PREDETERMINED RESOLUTION

(75) Inventors: Hsu-Feng Ho, Taipei (TW); Shun-Yung Wang, Taichung Hsien (TW)

(73) Assignee: Mediatek Inc., Hsinchu (TW)

( * ) Notice: Subject to any disclaimer, the term of this patent is extended or adjusted under 35 U.S.C. 154(b) by 19 days.

(21) Appl. No.: 11/064,023

(22) Filed: Feb. 23, 2005

(65) Prior Publication Data

US 2005/0240365 A1 Oct. 27, 2005

(30) Foreign Application Priority Data

Apr. 27, 2004 (TW) ............................... 93111792 A

(51) Int. Cl.
*G06F 19/00* (2006.01)
(52) U.S. Cl. .................... 702/72; 702/106; 375/226
(58) Field of Classification Search ................ 702/57, 702/66, 71–73, 75–77, 106, 189, 190; 324/76.12, 324/76.19, 76.21, 76.22, 76.24, 77.11, 76.28, 324/76.29, 76.38, 76.39, 76.41, 76.42, 76.77–76.79, 324/76.81–76.83; 375/226
See application file for complete search history.

(56) References Cited

U.S. PATENT DOCUMENTS

| | | | |
|---|---|---|---|
| 7,012,862 B2 * | 3/2006 | Hiratsuka | ................. 369/44.34 |
| 2001/0021059 A1 * | 9/2001 | Yariv | .......................... 359/264 |

* cited by examiner

*Primary Examiner*—Hal Wachsman
*Assistant Examiner*—Manuel L. Barbee
(74) *Attorney, Agent, or Firm*—Thomas, Kayden, Horstemeyer & Risley

(57) ABSTRACT

A phase difference between a first periodic signal, and a sample signal corresponding to a second periodic signal and having a predetermined signal resolution M is calculated in a phase comparing method. The sample signal is obtained by sampling the second periodic signal at a sampling frequency $f_s$ for one signal cycle of the second periodic signal when a frequency of the second periodic signal is not greater than an allowable sampling signal frequency $f_{ab}$ equal to $f_s/M$ or by conducting at least one of sampling the second periodic signal at $f_s$ for more than one signal cycle of the second periodic signal, and generating interpolated values for the sample signal after sampling the second periodic signal at $f_s$ in accordance with whether or not M/N yields a remainder and whether or not N is a prime number when the frequency of the second periodic signal is greater than and is N times $f_{ab}$.

26 Claims, 5 Drawing Sheets

PHASE COMPARING METHOD AND APPARATUS IN WHICH A SAMPLED PERIODIC SIGNAL HAS A PREDETERMINED RESOLUTION

CROSS-REFERENCE TO RELATED APPLICATION

This application claims priority of Taiwanese Application No. 093111792, filed on Apr. 27, 2004.

BACKGROUND OF THE INVENTION

1. Field of the Invention

The invention relates to phase comparing method and apparatus, more particularly to phase comparing method and apparatus in which a sampled periodic signal has a predetermined resolution.

2. Description of the Related Art

Phase comparison between two periodic signals is commonly applied to a phase-locked loop, and a servo loop in an optical recording apparatus, such as CD-ROM, DVD-ROM, DVD-RAM. At present, a digital signal processor (hereinafter referred to as DSP) is used to conduct phase comparison between two periodic signals. An allowable sampling signal frequency for a DSP depends on a sampling frequency of the DSP and a signal resolution, i.e., the allowable sampling signal frequency=the DSP sampling frequency/the signal resolution. For example, if the sampling frequency is 1 kHz, the allowable sampling signal frequency is 100 Hz when a sample signal obtained by sampling the periodic signal has 10 sampling points. Therefore, when the DSP sampling frequency is fixed, the higher the frequency of the periodic signal frequency, the lower will be the signal resolution of the sample signal, which can result in error during phase comparison.

SUMMARY OF THE INVENTION

Therefore, the object of the present invention is to provide phase comparing method and apparatus in which a sampled periodic signal has a predetermined resolution.

According to one aspect of the present invention, there is provided a phase comparing method for comparing first and second periodic signals. The phase comparing method comprises the steps of:

a) sampling the second periodic signal, including the sub-steps of:

a-1) determining whether a frequency of the second periodic signal is greater than an allowable sampling signal frequency $f_{ab}$, which is obtained by dividing a sampling frequency $f_s$ by a predetermined signal resolution M, M being an integer;

a-2) upon determining that the frequency of the second periodic signal is not greater than the allowable sampling signal frequency $f_{ab}$, sampling the second periodic signal at the sampling frequency $f_s$ for at least one signal cycle of the second periodic signal and at the predetermined signal resolution M so as to obtain a sample signal corresponding to the second periodic signal; and a-3) upon determining that the frequency of the second periodic signal is greater than and is N times the allowable sampling signal frequency $f_{ab}$, N being an integer not smaller than 1, obtaining a sample signal corresponding to the second periodic signal and having the predetermined signal resolution M by conducting at least one of sampling the second periodic signal at the sampling frequency $f_s$ for more than one signal cycle of the second periodic signal, and generating interpolated values for the sample signal after sampling the second periodic signal at the sampling frequency $f_s$ in accordance with whether or not M/N yields a remainder and whether or not N is a prime number; and b) calculating a phase difference between the first periodic signal and the sample signal obtained in step a).

According to another aspect of the present invention, there is provided a phase comparing apparatus for comparing first and second periodic signals. The phase comparing apparatus comprises:

means for determining whether a frequency of the second periodic signal is greater than an allowable sampling signal frequency $f_{ab}$, which is obtained by dividing a sampling frequency $f_s$ by a predetermined signal resolution M, M being an integer;

means for sampling the second periodic signal at the sampling frequency $f_s$ for at least one signal cycle of the second periodic signal and at the predetermined signal resolution M so as to obtain a sample signal corresponding to the second periodic signal upon determining that the frequency of the second periodic signal is not greater than the allowable sampling signal frequency $f_{ab}$;

means for obtaining a sample signal corresponding to the second periodic signal and having the predetermined signal resolution M by conducting at least one of sampling the second periodic signal at the sampling frequency $f_s$ for more than one signal cycle of the second periodic signal, and generating interpolated values for the sample signal after sampling the second periodic signal at the sampling frequency $f_s$ in accordance with whether or not M/N yields a remainder and whether or not N is a prime number upon determining that the frequency of the second periodic signal is greater than and is N times the allowable sampling signal frequency $f_{ab}$, N being an integer not smaller than 1; and means for calculating a phase difference between the first periodic signal and the obtained sample signal.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
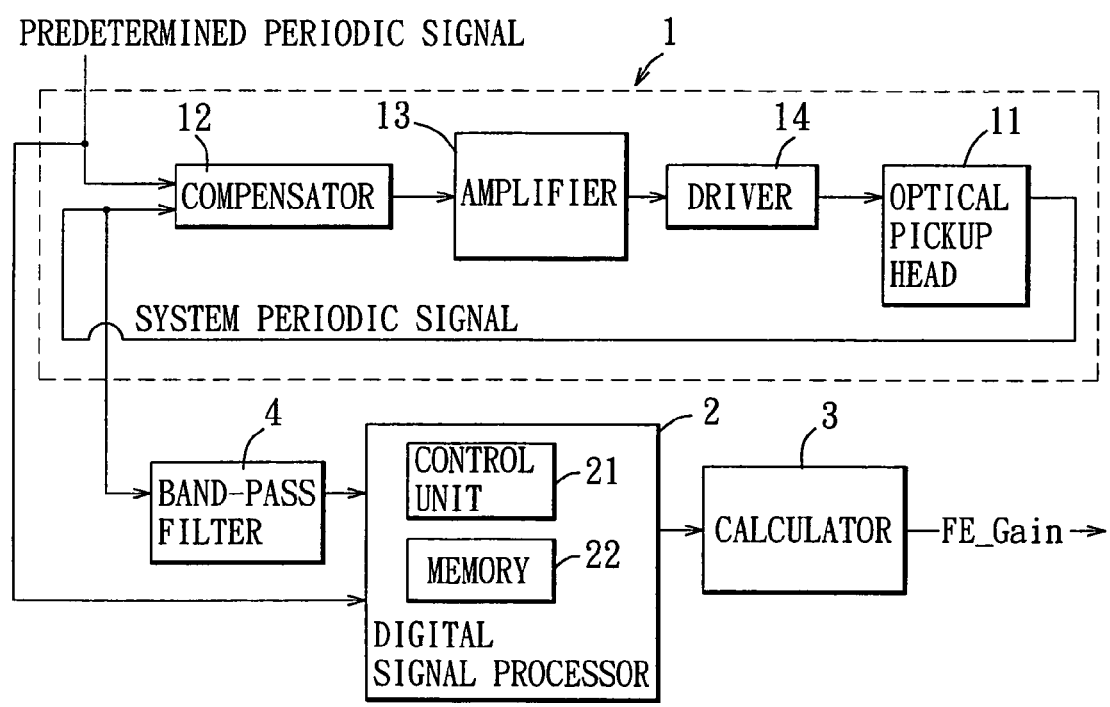
FIG. 1 is a schematic block diagram illustrating the configuration of a system loop used to exemplify the preferred embodiment of a phase comparing method according to the present invention.

FIG. 1 illustrates the configuration of a system loop 1, such as a track-locking/focus servo loop in an optical recording apparatus, used to exemplify the preferred embodiment of a phase comparing method according to the present invention. When the system loop 1 is activated, an optical pickup head 11 detects a periodic signal from an optical disc (not shown). The periodic signal, which serves as a system periodic signal, is sent to a compensator 12. The compensator 12 generates a compensating signal corresponding to the system periodic signal in accordance with a predetermined periodic signal. The compensating signal is amplified by an amplifier 13, and is then sent to a driver 14. The driver 14 drives the optical pickup head 11 to move in response to the amplified compensating signal so as to ensure proper positioning of the optical pickup head 11.

According to the method of the preferred embodiment, a digital signal processor 2 compares the predetermined periodic signal and the system periodic signal, and calculates a phase difference therebetween such that a corrected error signal gain value FE_Gain of the amplifier 13 is obtained via a calculator 3. Furthermore, a band-pass filter 4 is provided for filtering out noise in the system periodic signal. The digital signal processor 2 includes a control unit 21 and a memory 22.

Figure 2:
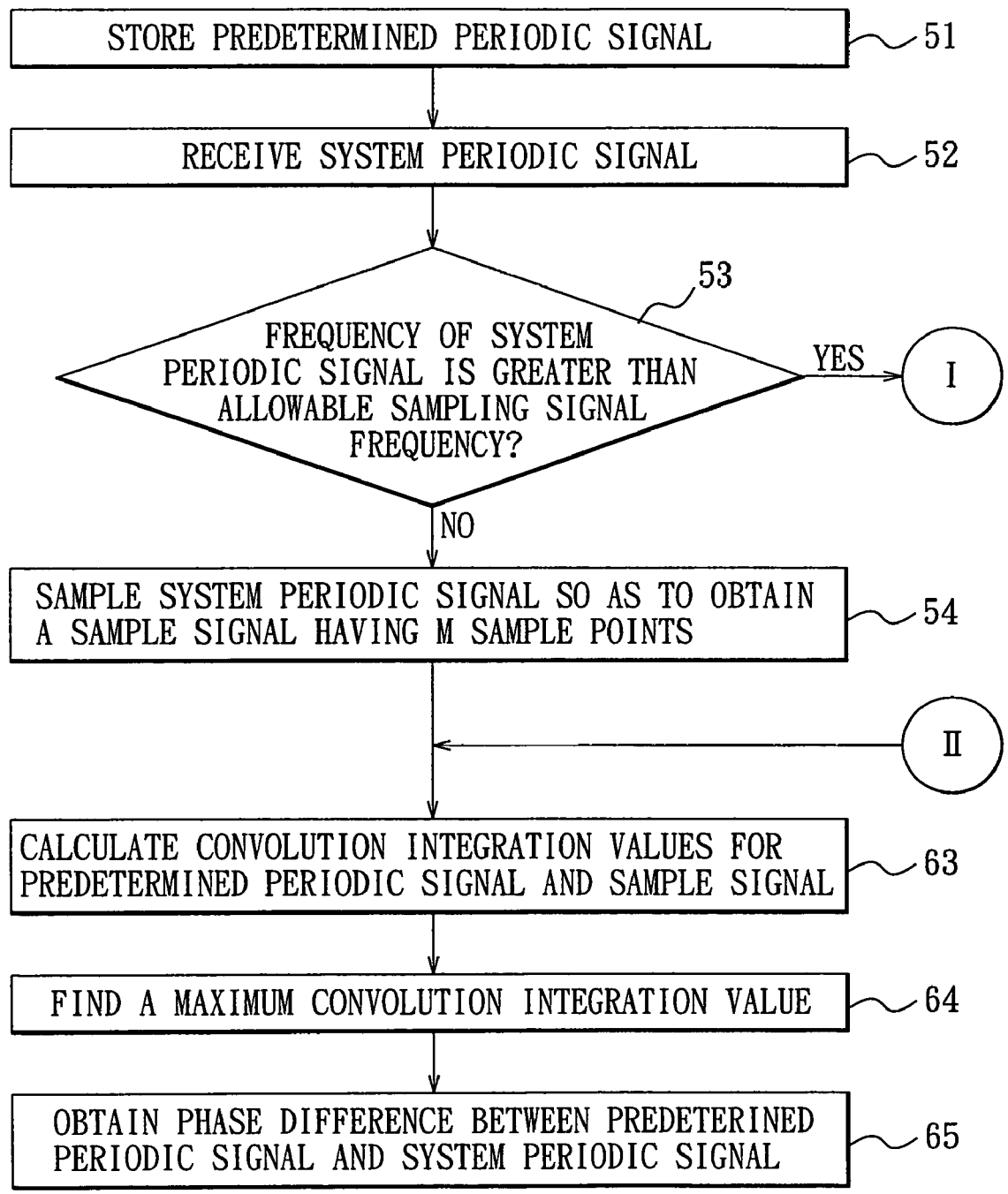
FIGS. 2 and 3 are flow charts illustrating how a digital signal processor compares a predetermined periodic signal and a system periodic signal in accordance with the method of the preferred embodiment.
Figure 3:
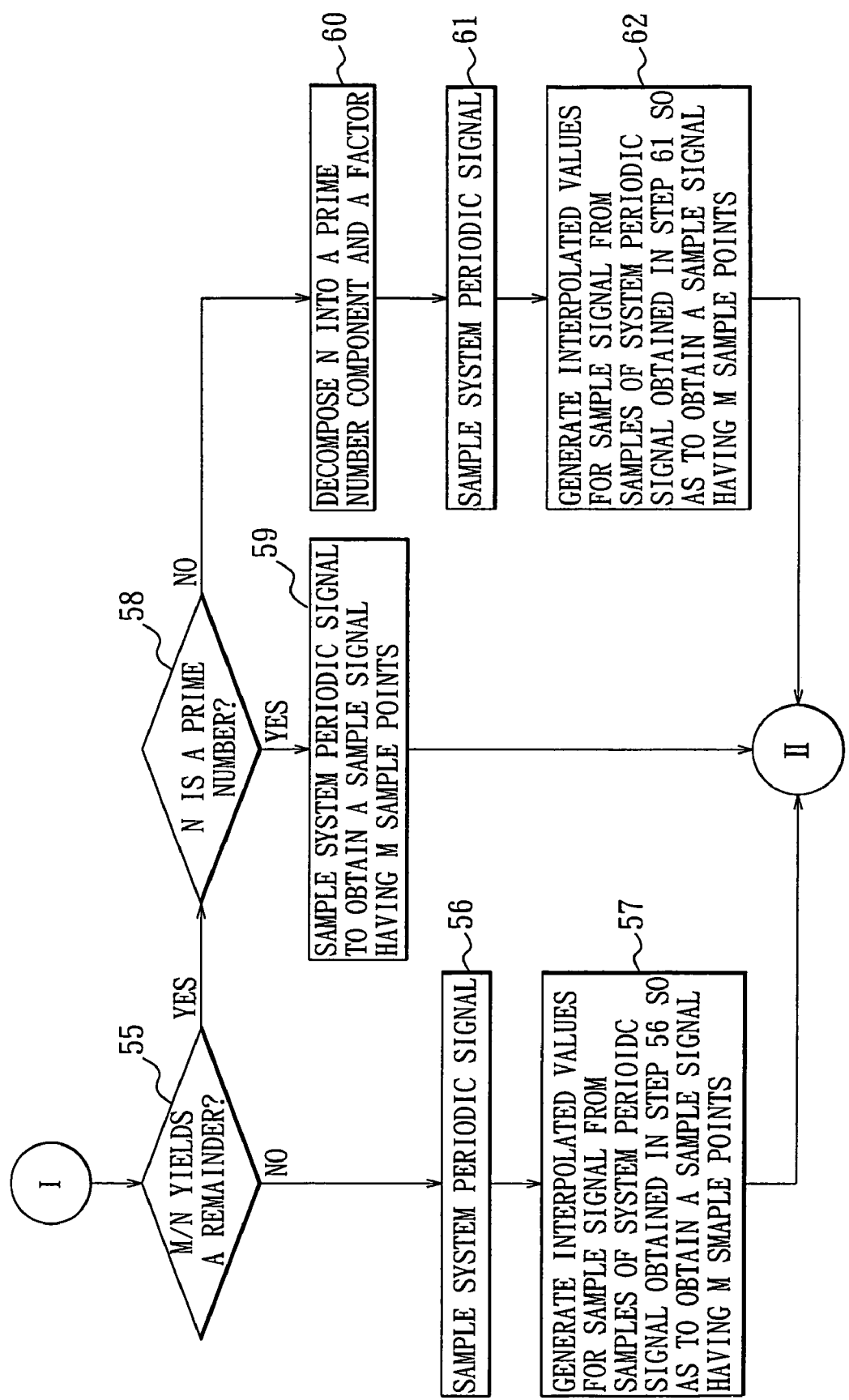

Referring to FIGS. 2 and 3, there is shown a flow chart illustrating how the digital signal processor 2 compares the predetermined periodic signal and the system periodic signal in accordance with the method of the preferred embodiment.

In step 51, the control unit 21 receives the predetermined periodic signal, which is a digital signal, and stores the predetermined periodic signal into the memory 22.

In step 52, the control unit 21 receives the filtered system periodic signal from the band-pass filter 4.

In step 53, the control unit 21 determines whether a frequency of the system periodic signal is greater than an allowable sampling signal frequency $f_{ab}$, which is obtained by dividing a sampling frequency $f_s$ of the digital signal processor 2 by a predetermined signal resolution M, wherein M is an integer.

In step 54, upon determining that the frequency of the system period signal is not greater than the allowable sampling signal frequency $f_{ab}$, the control unit 21 samples the system periodic signal at the sampling frequency $f_s$ for at least one signal cycle of the system periodic signal and at the predetermined signal resolution M so as to obtain a sample signal corresponding to the system periodic signal. In this embodiment, the sample signal obtained in step 54 has M sample points, each of which is a mean value obtained by averaging corresponding samples of the system periodic signal within a plurality of the signal cycles of the system periodic signal so as to minimize errors due to signal distortion and is stored in the memory 22.

In step 55, upon determining that the frequency of the system periodic signal is greater than and is N, which is an integer not smaller than 1, times the allowable sampling signal frequency $f_{ab}$, the control unit 21 determines whether M/N yields a remainder.

In step 56, upon determining that M/N does not yield a remainder, i.e., for example, if M=64, N can be 2 or 4, the control unit 21 samples the system periodic signal at the sampling frequency $f_s$ within at least one signal cycle of the system periodic signal. In this embodiment, in order to minimize errors due to signal distortion, the system periodic signal is sampled at the sampling frequency $f_s$ within a plurality of signal cycles of the system periodic signal to obtain a plurality of sample points, each of which is a mean value obtained by averaging corresponding samples of the system periodic signal within the plurality of signal cycles of the system periodic signal. For example, if M=64, and N=2, 32 sample points will be obtained in step 56.

In step 57, the control unit 21 generates interpolated values for a sample signal from samples of the system periodic signal obtained in step 56 such that the sample signal has the predetermined signal resolution M, i.e., the sample signal has M sample points. In this embodiment, the interpolated values for the sample signal are generated from the sample points obtained in step 56. According to the above example in step 55, 64 sample points are thus obtained in step 57.

In step 58, upon determining that M/N yields a remainder, the control unit 21 determines whether N is a prime number.

Figure 4:
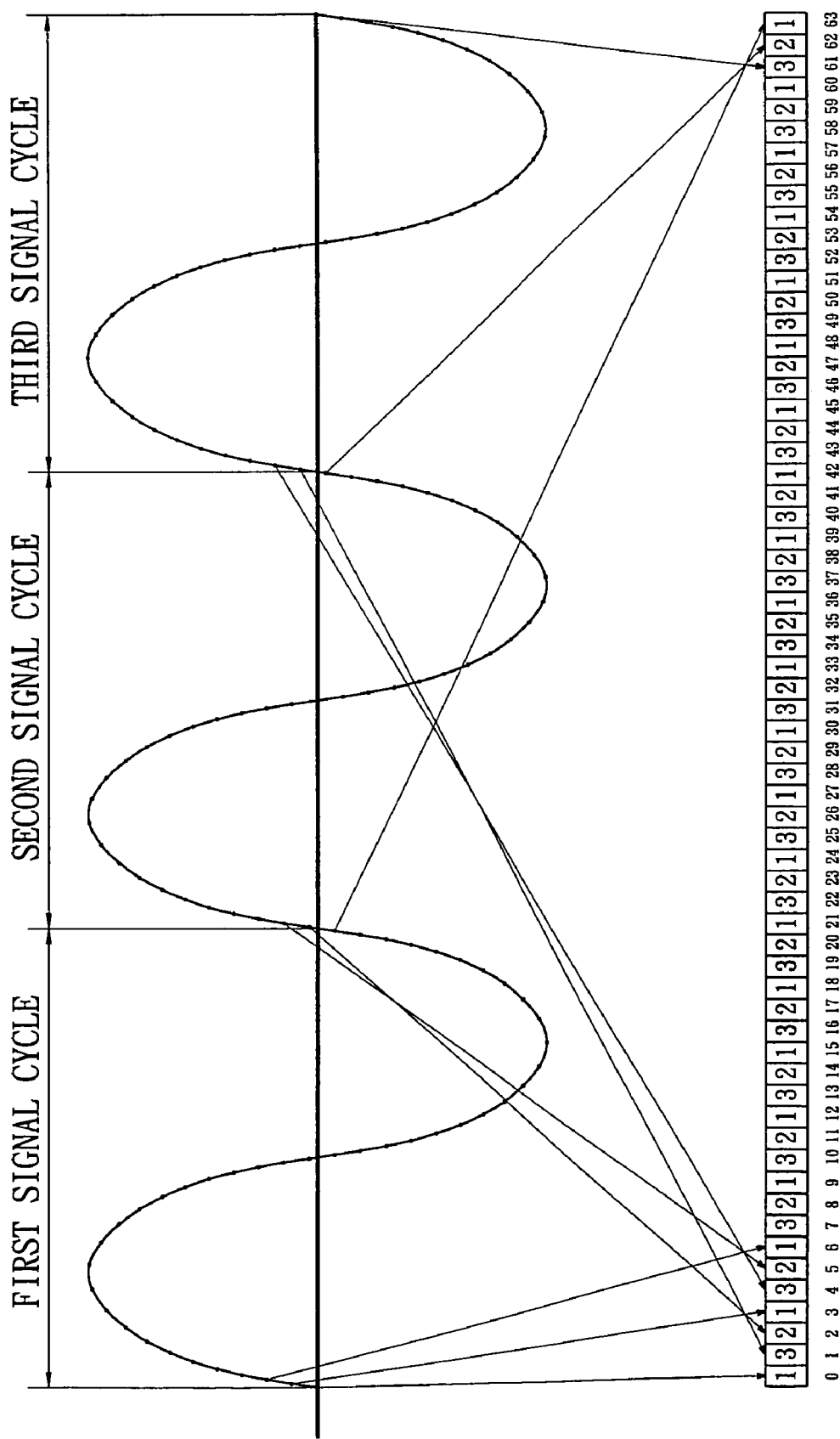
FIG. 4 is a schematic view illustrating how a sample signal corresponding to an exemplary system periodic signal is generated.

In step 59, upon determining that N is a prime number, the control unit 21 samples the system periodic signal at the sampling frequency $f_s$ for at least one set of N signal cycles of the system periodic signal to obtain a sample signal having M sample points that are stored in the memory 22. In this embodiment, each of the M sample points of the sample signal is a mean value obtained by averaging corresponding samples of the system periodic signal within more than one set of N signal cycles of the system periodic signal so as to minimize errors due to signal distortion. For example, if M=64 and N=3, the sample points sampled at the sampling frequency $f_s$ within a first one of each set of three signal cycles of the system periodic signal are respectively represented as a first group of a first one, a fourth one, . . . , a $64^{th}$ one of 64 sample points of the sample signal; the sample points sampled at the sampling frequency $f_s$ within a second one of each set of three signal cycles of the system periodic signal are respectively represented as a second group of a third one, a sixth one, . . . , a $63^{th}$ one of 64 sample points of the sample signal; and the sample points sampled at the sampling frequency $f_s$ within a third one of each set of three signal cycles of the system periodic signal are respectively represented as a third group of a second one, a fifth one, . . . , a $62^{th}$ one of 64 sample points of the sample signal, as best shown in FIG. 4.

In step 60, upon determining that N is not a prime number, the control unit 21 decomposes N into a prime number component P and a factor Q, in which M/P yields a remainder.

Thereafter in step 61, the control unit 21 samples the system periodic signal at the sampling frequency $f_s$ for at least one set of P signal cycles of the system periodic signal. In this embodiment, the system periodic signal is sampled at the sampling frequency $f_s$ more than one set of P signal cycles of the system periodic signal to obtain a plurality of sample points, each of which is a mean value obtained by averaging corresponding samples of the system periodic signal within the sets of P signal cycles of the system periodic signal.

Subsequently in step 62, the control unit 21 generates interpolated values for a sample signal from samples of the system periodic signal obtained in step 61 such that the sample signal has the predetermined signal resolution M, i.e., the sample signal has M sample points. For example, if M=64 and N=6=P×Q=3×2, 32 sample points of the sample signal will be obtained in step 61, and 64 sample points of the sample signal will be obtained in step 62.

In step 63, the control unit 21 calculates convolution integration values for the predetermined periodic signal, and the sample signal obtained in one of the steps 54, 57, 59 and

62. It is noted that the sample signal is phase-shifted by a corresponding integral multiple (R) of a phase shift unit for each of the convolution integration values. In this embodiment, the phase shift unit is not less than $$\frac{360°}{M}.$$

As such, the convolution integration values $C_0$, $C_1$, $C_2$, . . . , $C_{M-1}$ can be calculated according to the following Equation:

$$C_S = \sum_{i=0}^{M-1} A(i) \times B(i)$$

where A(i) is a value of a $(i+1)^{th}$ one of the 64 sample points of the predetermined periodic signal, B(i) is a value of a $(i+1)^{th}$ one of the 64 sample points of the system periodic signal, M is the predetermined signal resolution, and $C_s$ is the convolution integration value of the predetermined periodic signal and the sample signal phase-shifted by S phase shift units. Therefore, for example, assuming that the sample signal has 64 sample points, the convolution integration values of the predetermined periodic signal and the sample signal phase-shifted by S phase shift units can be expressed as $$C_s = A(0) \times B(0) + A(1) \times B(1) + \ldots + A(63) \times B(63).$$

In step 64, the control unit 21 finds a maximum one of the convolution integration values calculated in step 63.

In step 65, the control unit 21 obtains a phase difference between the predetermined periodic signal and the sample signal as a number of the phase shift units corresponding to the maximum one of the convolution integration values found in step 65.

Figure 5:
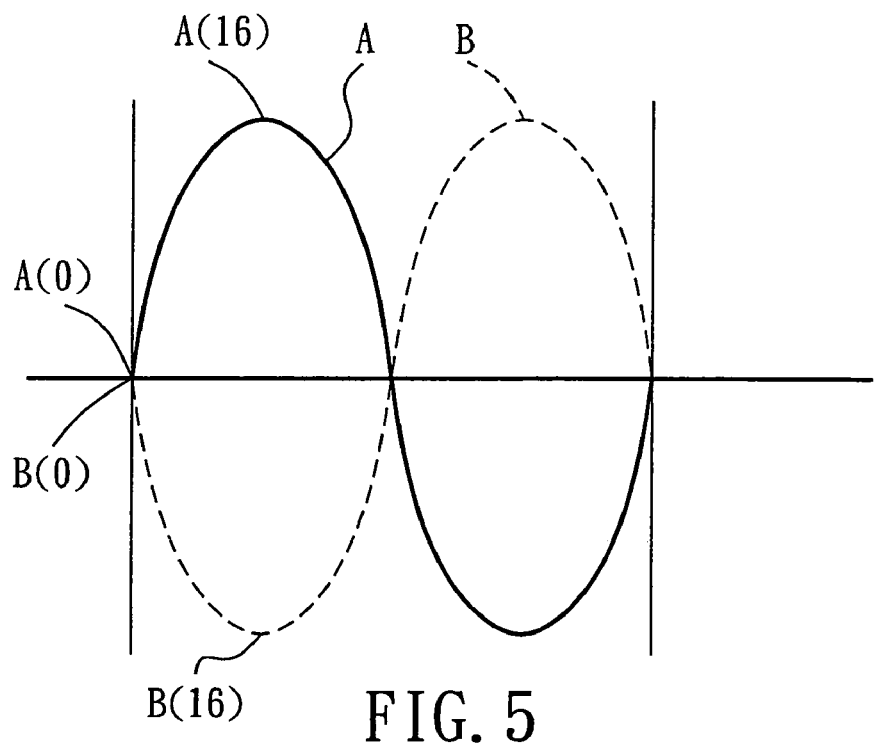
FIG. 5 is a plot showing a phase difference between a predetermined periodic signal and a sample signal corresponding to the system periodic signal.
Figure 6:
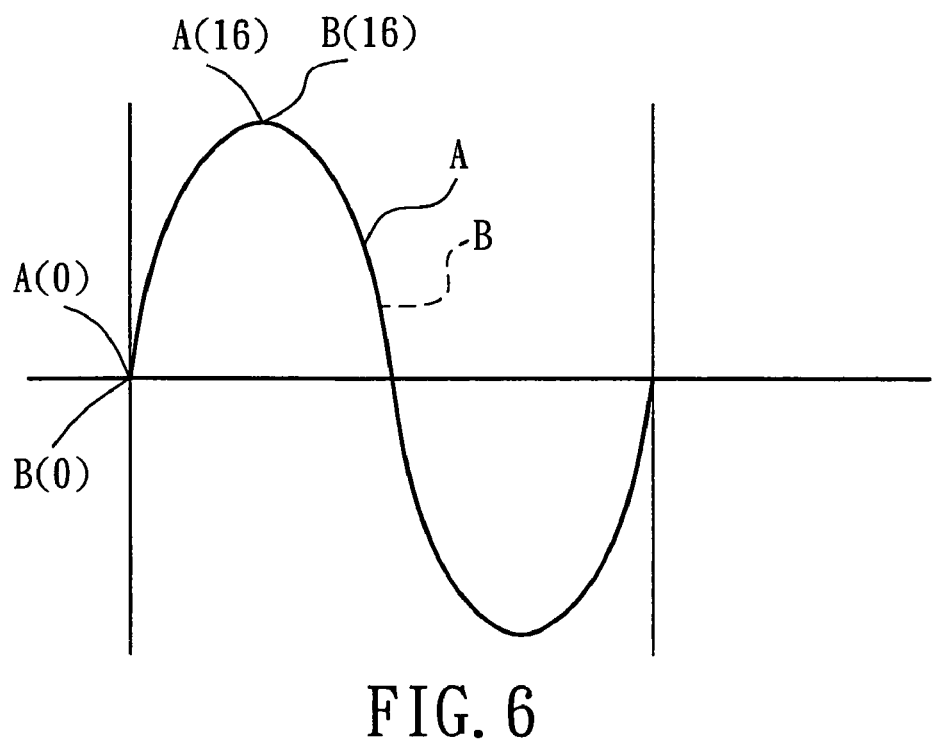
FIG. 6 is a plot illustrating how the phase difference in the example of FIG. 5 is obtained by convolution integration.

For example, if the predetermined signal resolution M is 64, the predetermined periodic signal (A) and the sample signal (B) corresponding to the system periodic signal are shown in FIG. 5. Therefore, $C_0$ can be calculated. When the sample signal is phase-shifted by 32 phase shift units $$\left(\text{i.e., } \frac{360°}{64} \times 32 = 180°\right),$$

as shown in FIG. 6, $C_{32}$ is found to have a maximum value such that the phase difference between the predetermined periodic signal and the sample signal is 180°.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A phase comparing method for comparing first and second periodic signals, comprising the steps of:
   a) sampling the second periodic signal to generate a sample signal having a predetermined signal resolution M, including the sub-steps of:
      a-1) determining whether a frequency of the second periodic signal is greater than an allowable sampling signal frequency $f_{ab}$, which is obtained by dividing a sampling frequency $f_s$ by the predetermined signal resolution M, M being an integer;
      a-2) upon determining that the frequency of the second periodic signal is not greater than the allowable sampling signal frequency $f_{ab}$, sampling the second periodic signal at the sampling frequency $f_s$ for at least one signal cycle of the second periodic signal and at the predetermined signal resolution M so as to obtain a sample signal corresponding to the second periodic signal; and
      a-3) upon determining that the frequency of the second periodic signal is greater than and is N times the allowable sampling signal frequency $f_{ab}$, N being an integer not smaller than 1, obtaining a sample signal corresponding to the second periodic signal and having the predetermined signal resolution M by conducting at least one of sampling the second periodic signal at the sampling frequency $f_s$ for more than one signal cycle of the second periodic signal, and generating interpolated values for the sample signal after sampling the second periodic signal at the sampling frequency $f_s$ in accordance with whether or not M/N yields a remainder and whether or not N is a prime number; and
   b) calculating a phase difference between the first periodic signal and the sample signal obtained in step a); and
   c) using the calculated phase difference to control a device.

2. The phase comparing method as claimed in claim 1, wherein, in step a-2), the sample signal has M sample points, each of which is a mean value obtained by averaging corresponding samples of the second periodic signal within a plurality of the signal cycles of the second periodic signal.

3. The phase comparing method as claimed in claim 1, wherein, in step a-3), when M/N does not yield a remainder, the sample signal is obtained by (i) sampling the second periodic signal at the sampling frequency $f_s$ within at least one signal cycle of the second periodic signal, and (ii) generating the interpolated values for the sample signal from samples of the second periodic signal obtained in sub-step (i) such that the sample signal has the predetermined signal resolution M.

4. The phase comparing method as claimed in claim 3, wherein, in sub-step (i), the second periodic signal is sampled at the sampling frequency $f_s$ within a plurality of signal cycles of the second periodic signal to obtain a plurality of sample points, each of which is a mean value obtained by averaging corresponding samples of the second periodic signal within the plurality of signal cycles of the second periodic signal.

5. The phase comparing method as claimed in claim 4, wherein, in sub-step (ii), the interpolated values for the sample signal are generated from the sample points obtained in sub-step (i).

6. The phase comparing method as claimed in claim 1, wherein, in step a-3), when M/N yields a remainder, and N is a prime number, the sample signal is obtained by (i) sampling the second periodic signal at the sampling frequency $f_s$ for at least one set of N signal cycles of the second periodic signal to obtain M sample points of the sample signal.

7. The phase comparing method as claimed in claim 6, wherein, in sub-step (i), each of the M sample points of the sample signal is a mean value obtained by averaging corresponding samples of the second periodic signal within more than one set of N signal cycles of the second periodic signal.

8. The phase comparing method as claimed in claim 1, wherein, in step a-3), when M/N yields a remainder, and N is not a prime number, N is decomposed into a prime number component P and a factor Q in which M/P yields a remainder, and the sample signal is obtained by (i) sampling the second periodic signal at the sampling frequency $f_s$ for at least one set of P signal cycles of the second periodic signal, and (ii) generating the interpolated values for the sample signal from samples of the second periodic signal obtained in sub-step (i) such that the sample signal has the predetermined signal resolution M.

9. The phase comparing method as claimed in claim 8, wherein, in sub-step (i), the second periodic signal is sampled at the sampling frequency $f_s$ within more than one set of P signal cycles of the second periodic signal to obtain a plurality of sample points, each of which is a mean value obtained by averaging corresponding samples of the second periodic signal within the sets of P signal cycles of the second periodic signal.

10. The phase comparing method as claimed in claim 9, wherein, in sub-step (ii), the interpolated values for the sample signal are generated from the sample points obtained in sub-step (i).

11. The phase comparing method as claimed in claim 1, wherein step b) includes the sub-steps of: b-1) calculating convolution integration values for the first periodic signal and the sample signal, in which the sample signal is phase-shifted by a corresponding integral multiple (R) of a phase shift unit for each of the convolution integration values; b-2) finding a maximum one of the convolution integration values calculated in step b-1); and b-3) obtaining the phase difference as a number of the phase shift units corresponding to the maximum one of the convolution integration values found in step b-2).

12. The phase comparing method as claimed in claim 11, wherein the phase shift unit is not less than $$\frac{360°}{M}.$$

13. The phase comparing method as claimed in claim 1, wherein the first periodic signal is a predetermined periodic signal, and the second periodic signal is a system periodic signal obtained via a system loop.

14. A phase comparing apparatus for comparing first and second periodic signals, said phase comparing apparatus comprising:
  means for determining whether a frequency of the second periodic signal is greater than an allowable sampling signal frequency $f_{ab}$, which is obtained by dividing a sampling frequency $f_s$ by a predetermined signal resolution M, M being an integer;
  means for sampling the second periodic signal at the sampling frequency $f_s$ for at least one signal cycle of the second periodic signal and at the predetermined signal resolution M so as to obtain a sample signal corresponding to the second periodic signal upon determining that the frequency of the second periodic signal is not greater than the allowable sampling signal frequency $f_{ab}$;
  means for obtaining a sample signal corresponding to the second periodic signal and having the predetermined signal resolution M by conducting at least one of sampling the second periodic signal at the sampling frequency $f_s$ for more than one signal cycle of the second periodic signal, and generating interpolated values for the sample signal after sampling the second periodic signal at the sampling frequency $f_s$ in accordance with whether or not M/N yields a remainder and whether or not N is a prime number upon determining that the frequency of the second periodic signal is greater than and is N times the allowable sampling signal frequency $f_{ab}$, N being an integer not smaller than 1; and
  means for calculating a phase difference between the first periodic signal and the obtained sample signal.

15. The phase comparing apparatus as claimed in claim 14, wherein the sample signal has M sample points, each of which is a mean value obtained by averaging corresponding samples of the second periodic signal within a plurality of the signal cycles of the second periodic signal.

16. The phase comparing apparatus as claimed in claim 14, wherein, when M/N does not yield a remainder, the sample signal is obtained by sampling the second periodic signal at the sampling frequency $f_s$ within at least one signal cycle of the second periodic signal, and generating the interpolated values for the sample signal from samples of the obtained second periodic signal such that the sample signal has the predetermined signal resolution M.

17. The phase comparing apparatus as claimed in claim 16, wherein the second periodic signal is sampled at the sampling frequency $f_s$ within a plurality of signal cycles of the second periodic signal to obtain a plurality of sample points, each of which is a mean value obtained by averaging corresponding samples of the second periodic signal within the plurality of signal cycles of the second periodic signal.

18. The phase comparing method as claimed in claim 17, wherein the interpolated values for the sample signal are generated from the obtained sample points.

19. The phase comparing method as claimed in claim 14, wherein, when M/N yields a remainder, and N is a prime number, the sample signal is obtained by sampling the second periodic signal at the sampling frequency $f_s$ for at least one set of N signal cycles of the second periodic signal to obtain M sample points of the sample signal.

20. The phase comparing apparatus as claimed in claim 19, wherein each of the M sample points of the sample signal is a mean value obtained by averaging corresponding samples of the second periodic signal within more than one set of N signal cycles of the second periodic signal.

21. The phase comparing method as claimed in claim 14, wherein, when M/N yields a remainder, and N is not a prime number, N is decomposed into a prime number component P and a factor Q in which M/P yields a remainder, and the sample signal is obtained by sampling the second periodic signal at the sampling frequency $f_s$ for at least one set of P signal cycles of the second periodic signal, and generating the interpolated values for the sample signal from samples of the second periodic signal such that the sample signal has the predetermined signal resolution M.

22. The phase comparing method as claimed in claim 21, wherein the second periodic signal is sampled at the sampling frequency $f_s$ within more than one set of P signal cycles of the second periodic signal to obtain a plurality of sample points, each of which is a mean value obtained by averaging corresponding samples of the second periodic signal within the sets of P signal cycles of the second periodic signal.

23. The phase comparing method as claimed in claim 22, wherein the interpolated values for the sample signal are generated from the sample points.

24. The phase comparing apparatus as claimed in claim 14, wherein said calculating means calculates convolution integration values for the first periodic signal and the sample signal, in which the sample signal is phase-shifted by a corresponding integral multiple (R) of a phase shift unit for each of the convolution integration values; finds a maximum one of the convolution integration values; and obtains the phase difference as a number of the phase shift units corresponding to the maximum one of the convolution integration values.

25. The phase comparing apparatus as claimed in claim 24, wherein the phase shift unit is not less than $$\frac{360°}{M}.$$

26. The phase comparing apparatus as claimed in claim 14, wherein the first periodic signal is a predetermined periodic signal, and the second periodic signal is a system periodic signal obtained via a system loop.

* * * * *